United States Patent [19]

Kiyama et al.

[11] Patent Number: 4,755,475
[45] Date of Patent: Jul. 5, 1988

[54] METHOD OF MANUFACTURING PHOTOVOLTAIC DEVICE

[75] Inventors: Seiichi Kiyama, Neyagawa; Yasuaki Yamamoto, Higashi-Osaka; Hideki Imai, Hirakata; Yutaka Hirono, Neyagawa, all of Japan

[73] Assignee: Sanyo Electric Co., Ltd., Japan

[21] Appl. No.: 15,691

[22] Filed: Feb. 17, 1987

[30] Foreign Application Priority Data

Feb. 18, 1986 [JP] Japan ................................ 61-34800
Feb. 18, 1986 [JP] Japan ................................ 61-34801
Jan. 20, 1987 [JP] Japan ................................ 62-11703

[51] Int. Cl.$^4$ ........................................... H01L 31/18
[52] U.S. Cl. ........................................ 437/4; 136/244; 136/258; 148/DIG. 93; 148/DIG. 153; 437/51; 437/173; 437/205; 219/121.61; 219/121.68; 219/121.69
[58] Field of Search ................. 437/2, 4, 51, 173, 189, 437/190, 192, 194, 205, 228, 245; 148/DIG. 93, DIG. 153; 136/244, 258 AM; 219/121 LA, 121 LH, 121 LJ

[56] References Cited

U.S. PATENT DOCUMENTS 4,591,471  6/1986  Yamazaki .......................... 136/249
4,650,524  3/1987  Kiyama et al. ...................... 148/1.5
4,667,058  5/1987  Catalano et al. ................... 136/244

OTHER PUBLICATIONS

S. Yamazaki et al., Chapter 4.3 "Laser Scribing Lithography", *Jarect*, vol. 16, North-Holland Pub. Co. (1984), pp. 149–167.

*Primary Examiner*—Aaron Weisstuch
*Attorney, Agent, or Firm*—Darby & Darby

[57] ABSTRACT

A method of manufacturing a photovoltaic device, in which a plurality of photoelectric conversion elements comprising a first electrode layer, a semiconductive layer and a second electrode layer are laminatedly arranged on an insulative surface of a substrate and said photoelectric conversion elements are electrically connected in series with each other, comprising a step of dividedly arranging the first electrode layer on the surface of the substrate, a step of coating the semiconductive layer on the surface of the substrate including the upper surface of the divided first electrode layer, a step of coating the second electrode layer on the semiconductive layer, and a step of dividing the semiconductive layer and/or the second electrode layer in order to define each element by irradiating energy-beams on the semiconductive layer and/or the second electrode layer. The formation of a low resistance layer in the semiconductive layer and a residual molten second electrode layer can be prevented by using energy-beams having an energy-distribution substantially uniform over the entire irradiated zone. In addition, short-circuits between the adjacent photoelectric conversion elements can be prevented.

42 Claims, 14 Drawing Sheets

F I G. 29
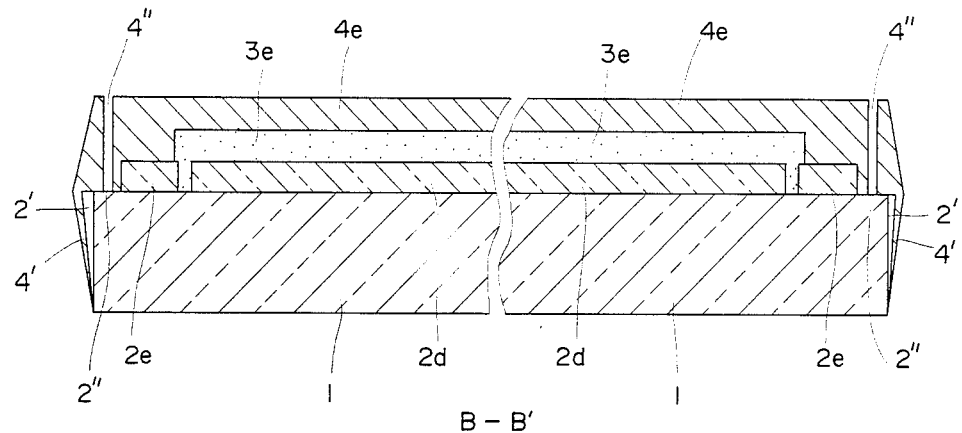
B - B'
F I G. 30
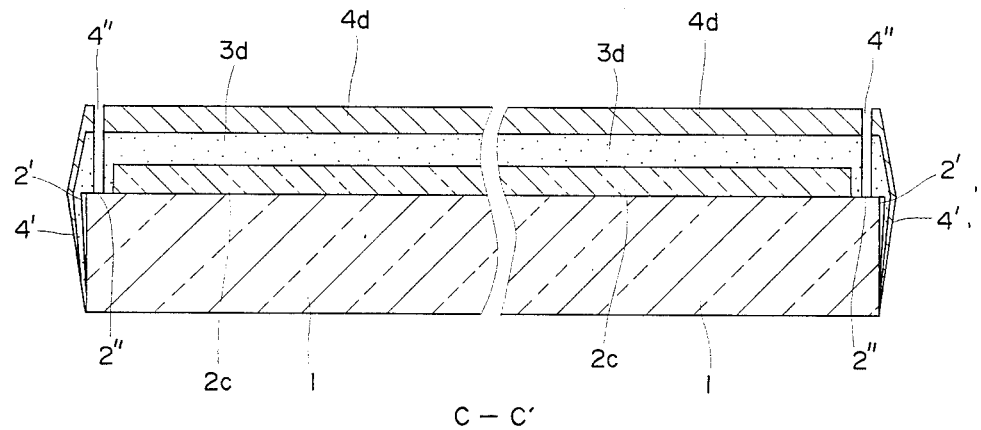
C - C'

METHOD OF MANUFACTURING PHOTOVOLTAIC DEVICE

BACKGROUND OF THE INVENTION

1. Field of the Invention

The present invention relates to a method of manufacturing a photovoltaic device utilizing an energy beam such as a laser beam.

2. Description of the Prior Art

FIG. 1 is a schematic diagram showing a basic construction of a photovoltaic device which is disclosed in U.S. Pat. No. 4,281,208 and has been already practically used. Transparent electrode layers $2a$, $2b$, $2c$... as first electrode layers are coated on an insulative and light-permeable substrate 1, such as glass and heat-resisting plastics, at regular intervals and amorphous semiconductive layers $3a$, $3b$, $3c$... in other words, "active semiconductive regions", such as of amorphous silicon, are coated on each of said transparent electrode layers $2a$, $2b$, $2c$... In addition, back electrode layers $4a$, $4b$, $4c$... as second electrode layers are coated on each of said amorphous semiconductive layers $3a$, $3b$, $3c$... and are connected to each of said transparent electrode layers $2b$, $2c$... adjacent thereto, respectively, on the right side thereof. Photoelectric converter elements $5a$, $5b$, $5c$... are thus respectively formed of a laminated aggregate comprising transparent electrode layer $2a$, amorphous semiconductive layer $3a$ and back electrode layer $4a$, a laminated aggregate comprising transparent electrode layer 2, amorphous semiconductive layer $3b$ and back electrode layer $4b$, a laminated aggregate comprising transparent electrode layer $2c$, amorphous semiconductive layer $3c$ and back electrode layer $4c$,..

Each of said amorphous semiconductive layers $3a$, $3b$, $3c$... includes, for example, a PIN junction parallel to its surface. Accordingly, if light is incident upon said light-permeable substrate 1 and said transparent electrode layers $2a$, $2b$, $2c$... in turn, an electrical voltage is generated. Electrical voltages generated within said amorphous semiconductive layers $3a$, $3b$, $3c$... are added in series and taken out by connecting each of said back electrode layers $4a$, $4b$, $4c$... to each of said transparent electrode layers $2b$, $2c$... adjacent to said back electrode layers $4a$, $4b$, $4c$... on the right side of said back electrode layers $4a$, $4b$, $4b$... respectively.

In the prior art manufacture of a photovoltaic device having such a construction, a photo-etching technique which is superior in precision workability has been used. In the event of using this technique, a step of coating the transparent electrode layer over the entire surface of the substrate 1, a step of separating individual transparent electrodes layer $2a$, $2b$, $2c$... by etching using a photoresist as a mask, that is to say, a step of selectively removing the transparent electrode layer to form spaces between the adjacent transparent electrode layers, a step of coating the amorphous semiconductive layer over the entire surface of the substrate 1 including the surface of each transparent individual amorphous semiconductive layer $3a$, $3b$, $3c$... by etching using a photoresist as a mask, that is to say a step of selectively removing the amorphous semiconductor layer to form spaces between the adjacent amorphous semiconductive layers, are carried out in turn.

Although the photo-etching technique is superior in precision workability, defects due to pin holes of the photoregistry defining the etching pattern or the separation on the circumferential edge are apt to be produced in the amorphous semiconductive layer.

In addition, according to a prior art process disclosed in U.S. Pat. No. 4,292,092, the spaces between the adjacent amorphous semiconductive layers are formed by eroding the layer by means of the irradiation of laser beams. This prior art process, which is superior in precision workability without using a photo-resist required in the photo-etching technique, that is to say, a wet process, is remarkably effective for solving the above described problem.

As described above, although the laser machining using no wet process is remarkably effective in precision workability, the following problems are present in the laser machining process. The problems which occur when the back electrode layer is removed by irradiating laser beams on the back electrode layer are described below.

If the back electrode layer is continuously formed extending over the transparent electrode layers $2a$, $2b$... and the amorphous semiconductive layers $3a$, $3b$... dividedly arranged for every one of the respective photoelectric conversion elements $5a$, $5b$..., the back electrode layer must be divided for every one of the photoelectric conversion elements $5a$, $5b$..., and the back electrode layer or both the back electrode layer and the semiconductive layer positioned in the spaces between the adjacent photoelectric conversion elements is (are) removed by irradiating laser beams in order to electrically connect the photoelectric conversion elements $5a$, $5b$... in series. In this process, a portion of the semiconductive layer, on which a circumferential edge portion of the laser beam (LB) is irradiated, does not receive sufficient energy for removal thereof, as shown in FIGS. 2 and 3, so that it is annealed and consequently microcrystallized or crystallized, thereby forming low resistance layers 6, 6a, 6b. In addition, in the event that the back electrode layers $4a$, $4b$... have a mono- or multi-layer structure formed of an ohmic metal, such as Al, Ti, Ag or their alloys, so as to form an ohmic contact with the semiconductive layers $3a$, $3b$..., such an ohmic metal has a high reflection factor for the laser beam irradiated thereon and a good heat conductance, so that the molten back electrode layer tends to flow into the removed portion to produce droplets 7, 7a, 7b, as shown in FIGS. 4 and 5.

Besides, in the event that a thin metallic layer is subjected to a cutting process using laser beams, the edge portion of the cut groove is usually not sharp and frequently a metallic thin film, which has not been removed, remains adhered to the edge portion of the cut groove. Such a residual back electrode layer portions have the same shape as the droplets 7, 7a, 7b in many cases.

In the event that such low resistance layers 6, 6a, 6b of the semiconductive layer are formed, the back electrode layers $4a$, $4b$... are not electrically separated by irradiating laser beams even through they are physically separated, and besides, the droplets 7, 7b of the back electrode layer $4b$ and the residual, back electrode layer portions electrically connect the transparent electrode layers $2b$... of the photoelectric conversion element $5b$... with the back electrode layers $4b$... of the same photoelectric conversion elements $5b$... to form a short-circuit.

The above described problems occur not only in the process of removing the back electrode layer but also in the process of removing the semiconductive layer.

SUMMARY OF THE INVENTION

The present invention was achieved in order to solve the above described problems.

A first object of this invention is to provide a method of producing a photovoltaic device, in which an energy beam having a substantially uniform energy distribution over the entire irradiation zone is irradiated on the semiconductive layer or the back electrode layer to remove the semiconductive layer or the back electrode layer within said irradiation zone and separate said semiconductive layer or said back electrode layer for every photoelectric conversion element, whereby the formation of the low resistance layer in the semiconductive layer, the generation of droplets of the molten back electrode layer and the formation of the residual back electrode layer portions can be prevented.

A second object of this invention is to provide a method of producing a photovoltaic device capable of completely preventing the low resistance layer from being formed in the semiconductive layer by simultaneously removing the portion of the semiconductive layer underlying the back electrode layer in the portion to be removed.

A third object of this invention is to provide a method of producing a photovoltaic device capable of removing the electrode layer at temperatures equal to or less than the melting point of the back electrode layer and preventing the droplets of the molten back electrode layer and the residual back electrode layer portions from being formed by irradiating an energy beam having an energy distribution which is substantially uniform over the entire irradiating zone on the back electrode layer having a multi-layer structure comprising metallic layers, or light-transmissible conductive oxide layers (TCO layers) such as $SnO_2$ layers and ITO layers of suitable thickness laminated from the substrate side to remove the electrode layer within the irradiating zone and separate the electrode layer for each photoelectric conversion element.

A fourth object of this invention is to provide a method of producing a photovoltaic device which employs a higher melting point back electrode layer comprising a multilayer alloy structure whereby removal of the back electrode layer at temperatures equal to or less than its melting point is made possible.

It is a fifth object of the present invention to provide a method of manufacturing a photovoltaic device which is capable of completely preventing undesirable short-circuits between the photoelectric conversion elements and the electrode portions by irradiating energy beams on the portions of the circumferential edge portions, where the transparent electrode layer has been removed in order to separate the back electrode layer without harming the output characteristics of the photovoltaic device.

It is a sixth object of the present invention to provide a method of manufacturing a photovoltaic device which is capable of simultaneously forming the output electrode portions of the photovoltaic device by irradiating energy beams on the end portion of the substrate to divide a part of the end portion thereof during the dividing process of the back electrode layer.

The above and further objects and features of the invention will more fully be apparent from the following detailed description with accompanying drawings.

BRIEF DESCRIPTION OF THE DRAWINGS

FIGS. 29 and 30 are schematic sectional views of fig. 27 taken along the direction transverse to the series-connecting direction thereof (lines B—B' and C'C', respectively).

DETAILED DESCRIPTION OF THE PREFERRED EMBODIMENTS

The present invention is described below with references to the drawings showing the preferred embodiments thereof. FIGS. 6 to 11 are schematic diagrams showing a method of the present invention in the order of the steps included in the method of the present invention.

Figure 1:
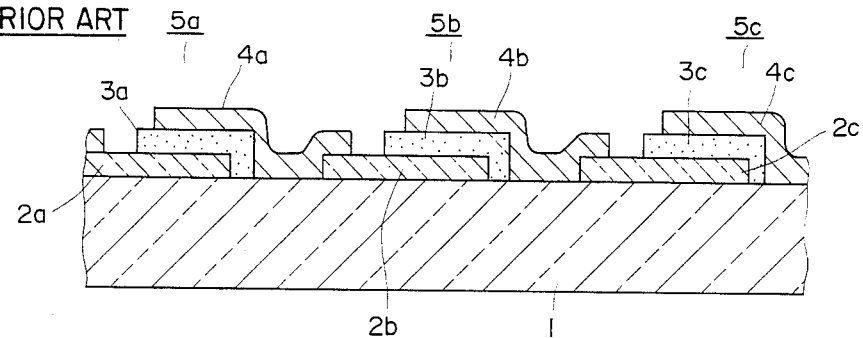
FIG. 1 is a sectional view showing a basic construction of a photovoltaic device.
Figure 6:
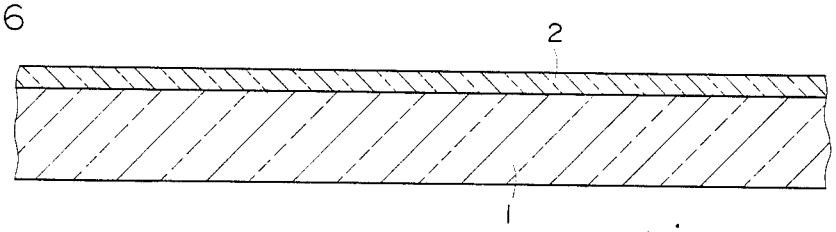
FIGS. 6 to 11 are sectional views showing the steps of the present invention.

In the step shown in FIG. 6, a transparent electrode layer 2 formed of $SnO_2$ of 2,000 to 5,000 A thickness is coated over the entire surface of a substrate 1 formed of transparent glass of 1 to 3 mm thick and having an area of about 10×10 cm to 1×1 m.

Figure 7:
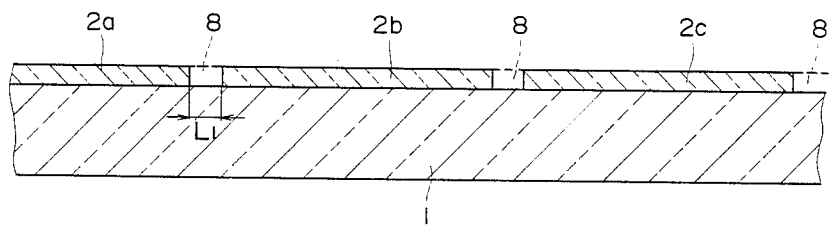

In the step shown in FIG. 7, the spaces 8 between adjacent transparent electrode layers are formed by irradiating laser beams thereon to form divided transparent electrode layers 2a, 2b, 2c . . . The laser beams have wave lengths so as to be hardly absorbed by the substrate 1. Pulse-output type laser beams having wave lengths of 0.35 to 2.5 m are preferably used for substrates 1 formed of glass. In such a preferred embodiment, Nd:YAG laser beams having a wave length of about 1.06 $\mu$m, an energy density of 13 J/cm$^2$ and a pulse-frequency of 3 KHz are used and the size (L$_1$) of the space 8 between the adjacent transparent electrode layers is set to be about 100 $\mu$m.

In addition, these divided transparent electrode layers can also be formed by etching using a photoresist as a mask.

Figure 8:
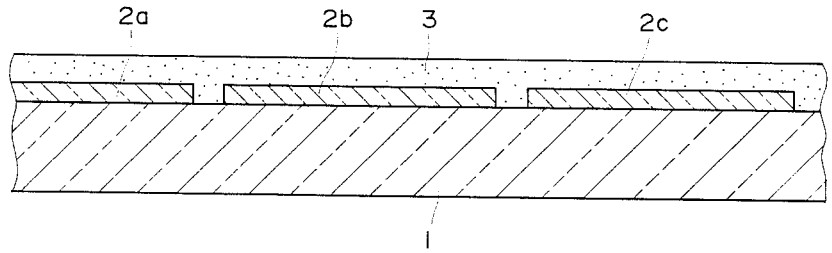
Figure 2:
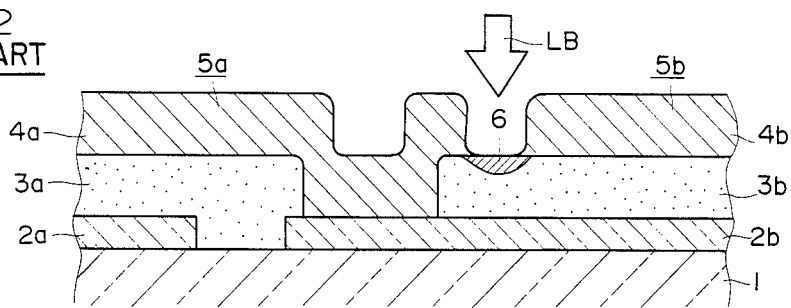
FIGS. 2 to 5 are sectional views, in which essential parts are enlarged, showing a photovoltaic device having defects incidental to the conventional method.
Figure 3:
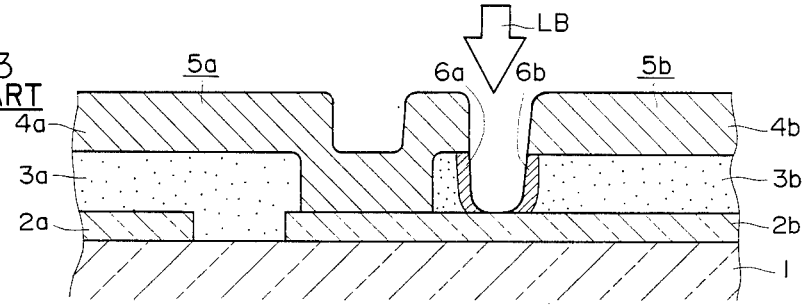
Figure 4:
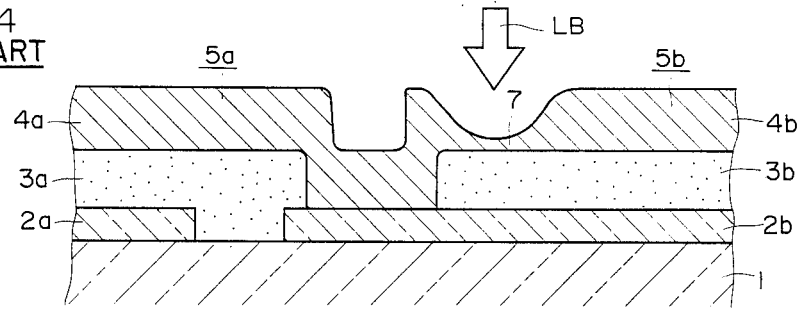
Figure 5:
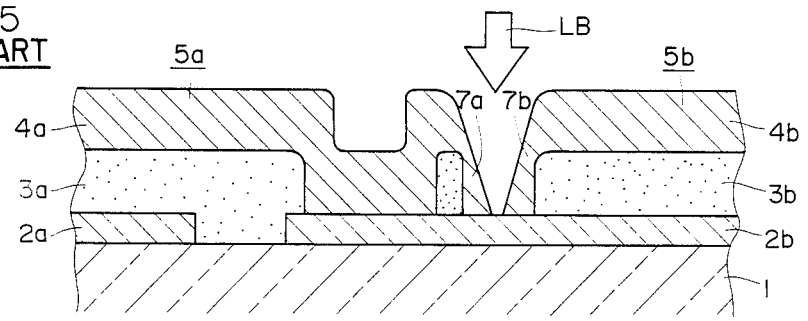

In the process shown in FIG. 8, an amorphous semiconductive layer 3, such as an amorphous silicon layer, having a thickness of 3,000 to 7,000 Å and effectively contributing to the photoelectric conversion process, is coated over the entire surface of the substrate 1 including the surface of each of the transparent electrode layers 2a, 2b, 2 . . . Such amorphous semiconductive layer 3 includes a PIN junction parallel to its surface. P-type amorphous silicon carbide, I-type amorphous silicon, and N-type amorphous silicon layers are coated in turn.

Figure 9:
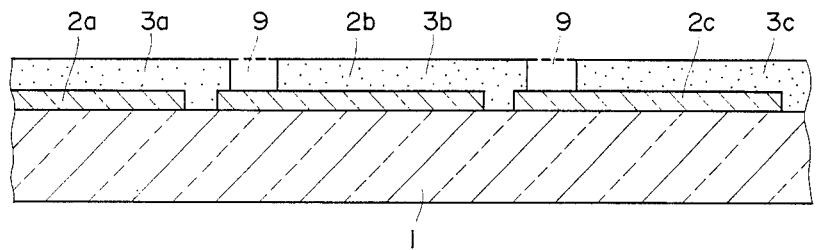
Figure 12:
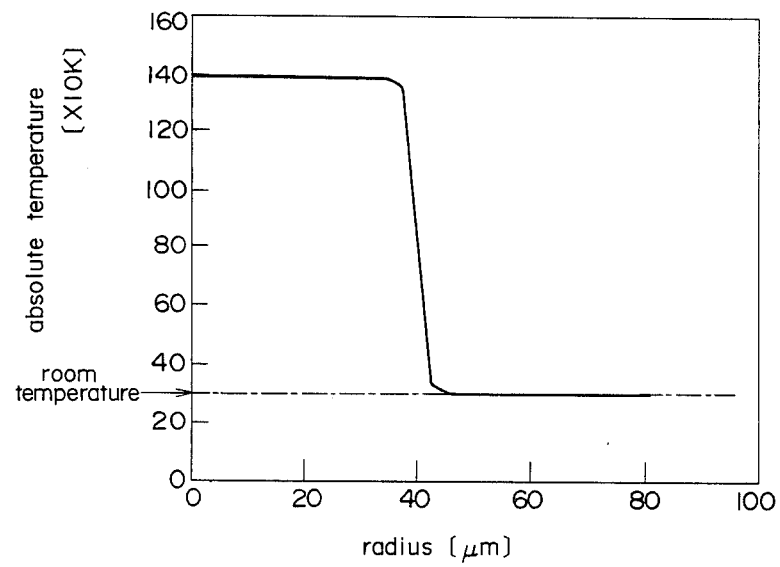
FIG. 12 is a temperature-distribution curve diagram showing the energy-distribution of the laser beams used in a method according to the present invention.

In the process shown in FIG. 9, spaces 9 between adjacent amorphous semiconductive layers are formed by irradiating laser beams thereon to form divided amorphous semiconductive layers 3a, 3b, 3c . . . This process is characterized by the use of laser beams having an energy-distribution which is substantially uniform over the entire irradiation zone. FIG. 12 shows the temperature-distribution on the irradiation surface in the radial direction with the central portion of the circular laser beam having an energy-distribution substantially uniform over the entire circular irradiation zone having a radius of 40 $\mu$m. It is obvious from FIG. 12 that the temperature-distribution of the laser beams having a substantially uniform energy-distribution consists of an almost constant high temperature-distribution zone and a temperature-gradient zone due to the slight heat conductance of the medium which is irradiated comprising a steep descent to room temperature at the zone not irradiated.

Figure 13:
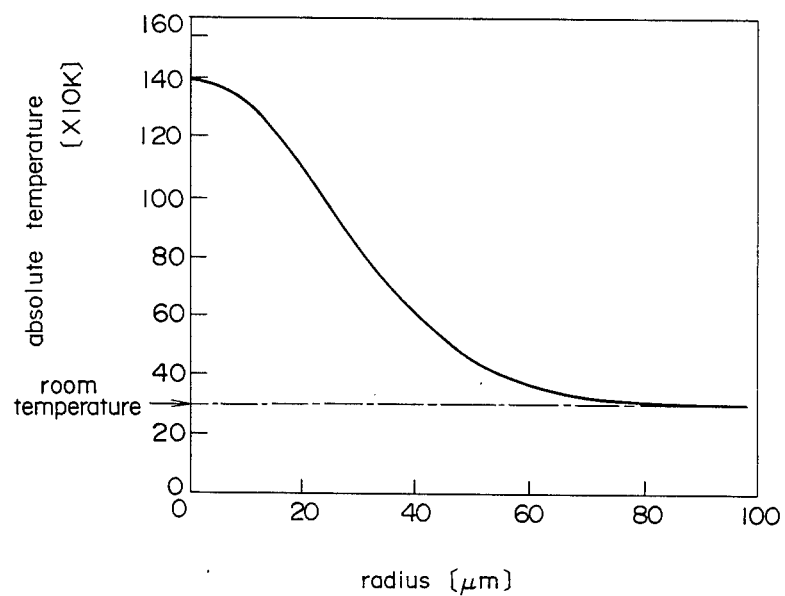
FIG. 13 is a temperature-distribution curve diagram explaining the energy-distribution in the conventional method.

One the other hand, FIG. 13 show a temperature-distribution of the irradiation zone in the radial direction with a central portion of laser beams having the conventional Gussian distribution and a radius of 50 $\mu$m in the same manner as in FIG. 12. The temperature at the central portion is equal in both cases shown in FIGS. 12 and 13. For example, said temperature is set at an absolute temperature of about 1,400K at which not only an amorphous semiconductive layer to be processed having a thickness of 5,000 Å can be removed by irradiating such laser beams thereon but also the transparent electrode layers 2a, 2b, 2c, . . . underlying the amorphous semiconductive layers 3a, 3b, 3c . . . can be prevented from being thermally damaged.

Figure 14:
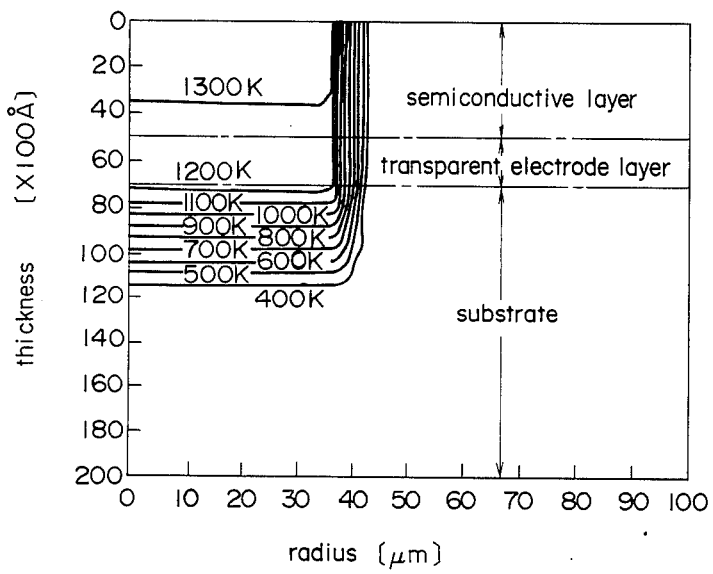
FIGS. 14 and 15 are isothermal distribution curve diagrams in the case where laser beams having energy-distributions are shown in FIGS. 12 and 13, respectively, are irradiated on an amorphous semiconductive layer.

FIG. 14 shows a temperature-distribution in the direction of thickness using isothermal lines of every 100K in the case when the energy-distribution is almost uniform and the temperature-distibution on the irradiation surface, that is to say the surface of the amorphous semiconductive layer 3, is shown in FIG. 12. The sample was prepared by laminating the transparent electrode layer 2 formed of a SnO$_2$ layer of 2,000 Å thick and an amorphous silicon semiconductive layer 3 of 5,000 Å thick on the glass substrate 1. If the surface of the semiconductive layer of such a sample is heated to about 4,400K, the semiconductive layer 3 shows a wide isothermaldistribution width in the direction of thickness and has temperatures of about 1,200K or more, at which the SnO$_2$ transparent electrode layer 2 can be removed. On the other hand, the isothermal-distribution width in the radial direction, that is to say the surface direction, is remarkably narrow since the temperature-gradient on the boundary surface is steeply reduced on the irradiation surface.

Although the temperature at which the amorphous silicon semiconductive layer 3 can be removed depends more or less upon the forming methods, forming conditions and the like of said semiconductive layer 3, in general it is about 1,200K or more, as above described. On the other hand, the temperature at which said amorphous silicon semiconductive layer 3 is annealed and converted into a low resistance layer is between about 1,000K and about 1,200K, at which said amorphous silicon semiconductive layer 3 is removed. Accordingly, provided that said semiconductive layer 3 has temperatures of 1,200K or more, it is removed, while said semiconductive layer 3 having temperatures of 1,000 to 1,200K is converted into the low resistance layer. The zone of said semiconductor layer 3 within a radius of 38 $\mu$m from the center of the laser beam is removed and the low resistive layer is hardly formed at the boundary surface.

Figure 15:
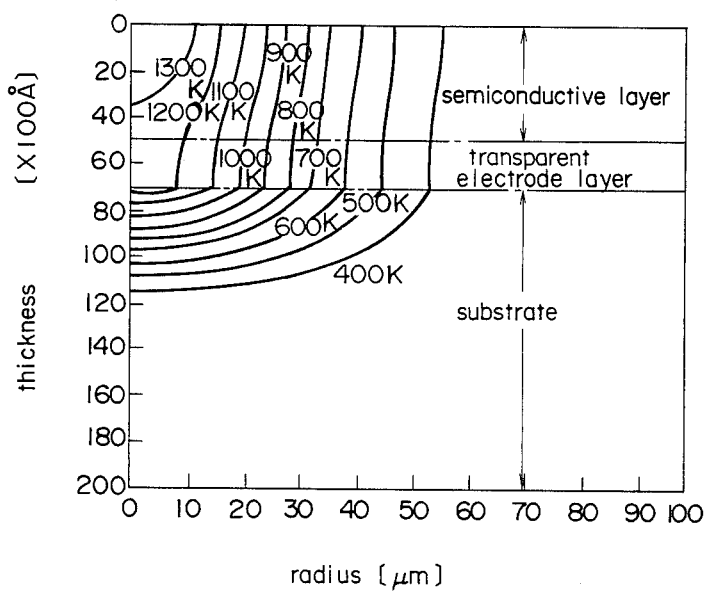

On the other hand, the temperature-distribution on the irradiation surface is a Gaussian-distribution equivalent to the energy-distribution shown in FIG. 13 in the case of using laser beams having the conventional Gaussian-distribution and a representation of the temperature-distribution in the direction of a layer thickness using isothermal lines of every 100K is shown in FIG. 15. That is to say, the temperature-distribution in the direction of layer thickness at the central portion of the irradiation zone is equal to the uniform distribution as shown in FIG. 14 but the isothermal-distribution width in the radial direction is about 8 $\mu$m on the irradiation surface and about 11 $\mu$m at on the boundary between the amorphous silicon semiconductive layer and the SnO$_2$ transparent electrode layer in an annealing temperature range of 1,200 to 1,000K since the temperature-gradient on the irradiation surface slopes gently. Accordingly, in the case of machining using laser beams having a Gaussian-distribution, the semiconductive layer is converted into a low resistance layer over a wide range of about 8 to 11 $\mu$m in the radial direction from the removed boundary surface thereof even though portions of the semiconductive layer having temperature of 1,200K or more are removed.

Moreover, in the conventional machining having the Gaussian-distribution, the removed width of the semiconductive layer is 10 $\mu$m or less in diameter which is narrow in comparison with about 38 $\mu$m in the machining shown in FIG. 14. As a result, according to the conventional method, in order to increase the removed width of said semiconductive layer with the aim of connecting adjacent photoelectric conversion elements electrically in series through portions of the transparent electrode layer exposed by removing the semiconductive layer, there are two possible methods. In one method, the intensity of the laser beam is increased to heighten the temperature at the central portion, thereby increasing the isothermal-distribution width in the temperature range of 1,200K or more, and in the other method the number of times the laser beam is scanned is increased, instead of increasing the intensity thereof.

However, according to either method, the low resistance layer is formed. Moreover, according to the first method, the central portion of the laser beam is in an extremely high-energy condition, which can cause thermal damage to the transparent electrode layer which is under the semiconductive layer, while according to the second method, the workability is reduced due to an increase of the number of times of scanning.

On the contrary, according to the method of the present invention, in which laser beams having an energy-distribution substantially uniform over the entire irradiation zone are used, the low resistance layer is not formed substantially, and the machining width can be increased without causing any thermal damage to the lower layer.

Figure 18:
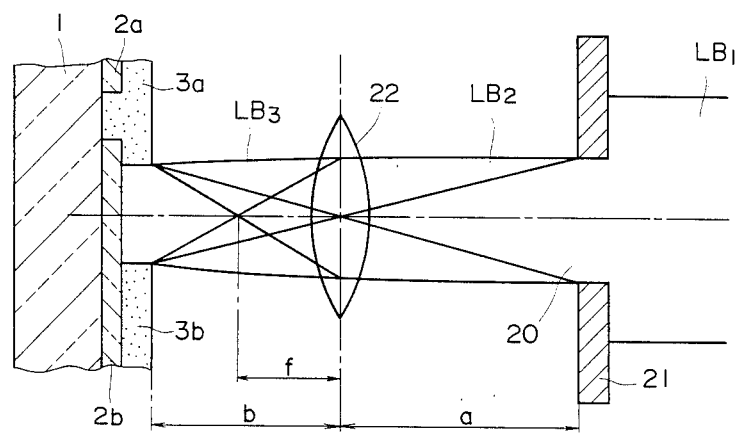
FIG. 18 is a schematic diagram showing the principle of the laser beam method used in the present invention.

As shown in FIG. 18, the above described laser beams having an energy-distribution essentially uniform over the entire irradiation zone are obtained by arranging an iris 21 provided with a square or round hole 20 having an opening diameter of about 25% of the diameter of the incident laser beam (LB$_1$) having the usual Gaussian energy-distribution. Laser beam (LB$_2$), which has passed through the round hole 20 of the iris 21, then impinges on collecting lens 22 and emerges as irradiating laser beam (LB$_3$), which in turn impinges on the surface to be machined on the basis of the following conditions. That is to say, provided that the distance from the iris 21 to the center of the collecting lens 22 is a, the distance from the center of the collecting lens 22 to the surface to be machined is b, the focal length of the collecting lens 22 is f, and $(1/a)+(1/b)=(1/f)$, the laser beam (LB$_3$) irradiated on said surface to be machined has a substantially uniform energy-distribution.

Figure 10:
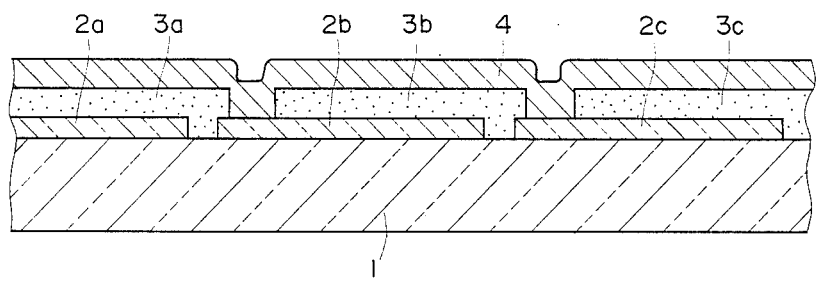

In the process shown in FIG. 10, a back electrode layer 4 of thickness of about 2,000 Å or more having an aluminum mono-layer structure or a double-layer structure, in which titanium or titanium-silver is laminated on aluminum, or a structure, in which such a double-layer structure is repeated, is coated over the entire substrate 1 including the exposed portions of the divided semiconductive layers 3a, 3b, 3c... and the transparent electrode layers 2a, 2b, 2c...

Figure 11:
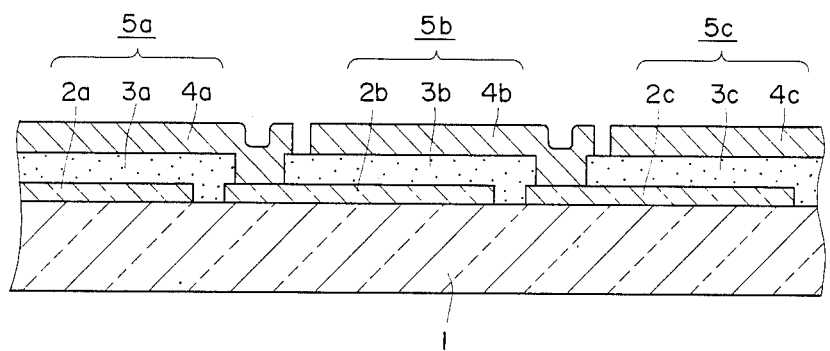

In the final process shown in FIG. 11, said back electrode layer 4 is divided into back electrode layers 4a, 4b, 4c... in the vicinity of the end faces of the amorphous semiconductive layers 3a, 3b, 3c... by irradiating laser beams having an energy-distribution substantially uniform over the entire irradiation zone thereon in the same manner as in the dividing process shown in FIG. 9. In this case, when the laser beams are irradiated on the back electrode layer, the fusion and scattering off the back electrode layer at temperatures at the melting point or greater of the back electrode layer and the thermal stress resulting from temperature-gradients leads to the partial removal of the back electrode layer.

As a result, photoelectric conversion elements 5a, 5b, 5c... formed of laminated aggregates comprising the divided transparent electrode layers 2a, 2b, 2c..., the divided amorphous semiconductive layers 3a, 3b, 3c... and the divided back electrode layers 4a, 4b, 4c..., respectively, are electrically connected in series on the substrate 1.

Figure 16:
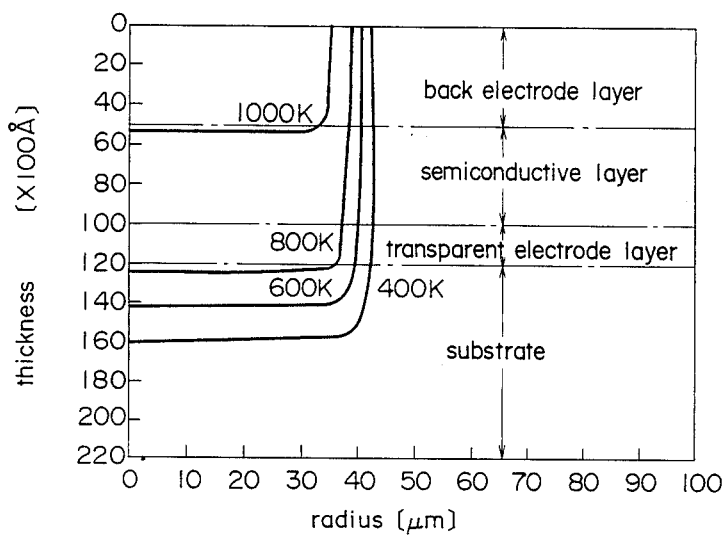
FIGS. 16 and 17 are isothermal distribution curve diagrams in the case where laser beams having energy-distributions shown in FIGS. 12 and 13, respectively, are irradiated on a back electrode layer.

FIG. 16 represents the temperature-distribution in the direction of layer thickness with the central portion of the irradiation surface as the starting point using isothermal lines of every 200K in the cause when laser beams having an energy-distribution shown in FIG. 12 are irradiated on the back electrode layer 4. A sample was prepared by coating a SnO$_2$ transparent electrode layer 2 of 2,000 Å thick, an amorphous semiconductive layer 3 of 5,000 Å thick and an aluminum back electrode layer 4 having a mono-layer structure of 5,000 Å on a glass substrate 1. As a result of laser beam irradiation according to the method of the invention, the mono-layer structured aluminum back electrode layer within a radius of 38 μm from the center attained a temperature-distribution of 930K, which is near to the melting point of aluminum and it was removed.

However, according to FIG. 16, a temperature-distribution of 1,000K or more exists at the interface of the amorphous silicon semiconductive layer 3 with the back electrode layer. The temperature-distribution of 1,000K or more means that the amorphous silicon semiconductive layer 3 in such a zone is micro-crystallized or crystallized and thus converted into a low resistance layer. However, the formation of this law resistive layer is substantially negligible since it is formed only in a very shallow zone just below the surface of the amorphous silicon semiconductive layer 3.

Figure 19:
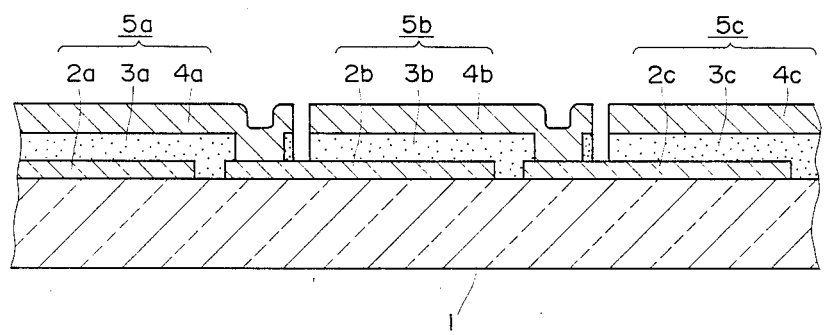
FIG. 19 is a sectional view showing another preferred embodiment of the final step of a method according to the present invention.

In addition, in order to prevent the formation of this low resistive layer it is necessary only to remove the low resistance layer by etching with the back electrode layers 4a, 4b, 4b... acting as etch-resistant masks or to remove not only the back electrode layer 4 but also the portion of this amorphous semiconductive layer 3 which exists under the back electrode layer 3 during the step for removing the back electrode layer 4, as shown in FIG. 19.

Accordingly, the back electrode layers 4a, 4b, 4c... divided in the final step shown in FIG. 11 are physically as well as electrically separated and the adjacent photoelectric conversion elements 5a, 5b, 5c... are connected in series.

Figure 17:
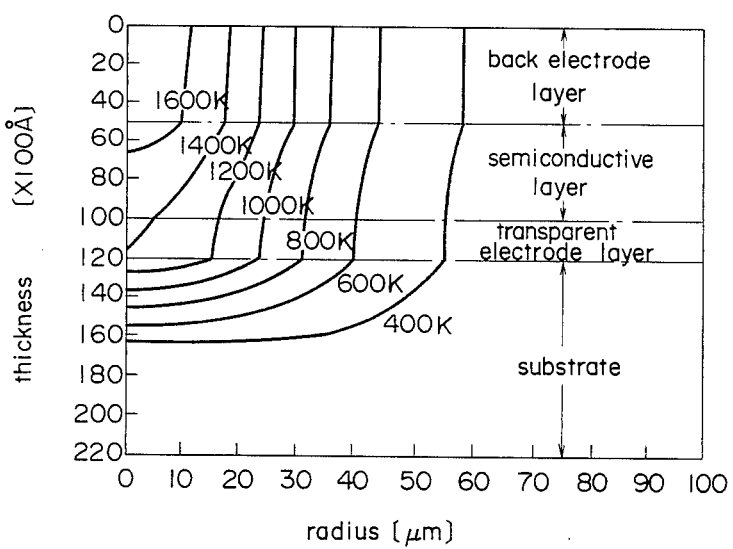

FIG. 17 shows a temperature-distribution in the direction of layer thickness using isothermal lines of every 200K in the case when conventional laser beams having a Gaussian-distribution are used to obtain a removal width of the back electrode layer 4 almost the same as that in the laser machining shown in FIG. 16. In this case, since the temperature-gradient slopes gently, the temperature-distribution width in the vicinity of the melting point of the back electrode layer 4 is wide and droplets of the molten back electrode layer are generated at the boundary surface where the back electrode layer 4 was removed or, not only the portions of the amorphous semiconductive layer 3 having temperatures of 1,200K or more are removed, but also the boundary surfaces where the portions of the amorphous semiconductive layer 3 were removed, having attained temperatures of 1,200 to 1,000K are converted into low resistance layers.

Figure 20:
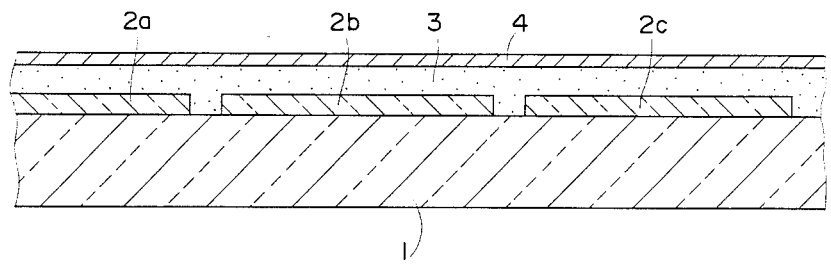
FIGS. 20 to 23 are sectional views showing each step of another preferred embodiment of a method according to the present invention.
Figure 21:
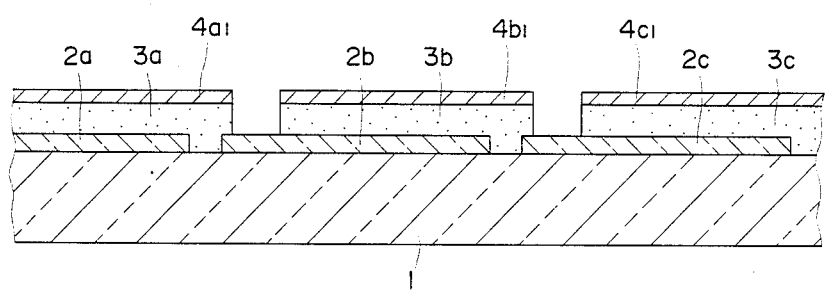
Figure 22:
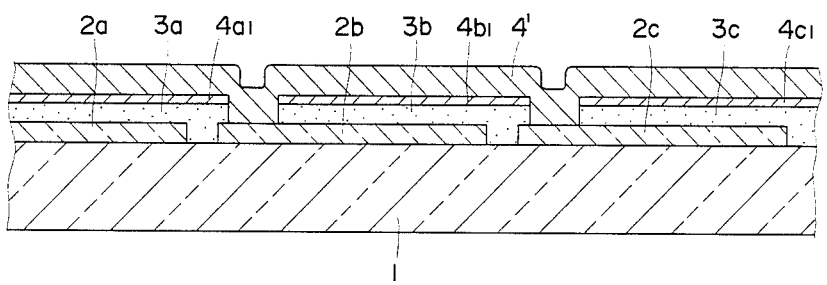
Figure 23:
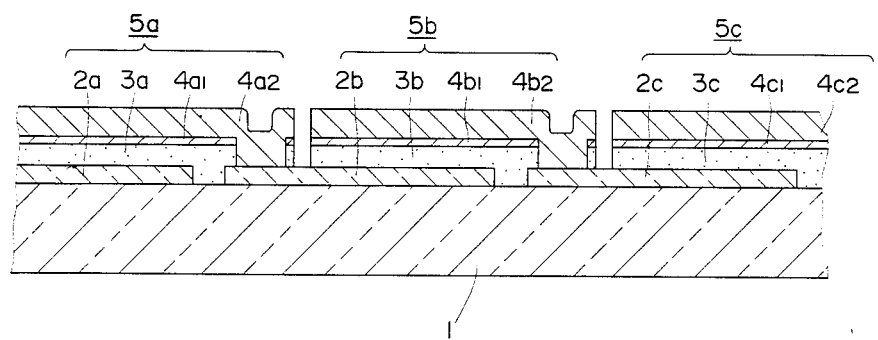

In the case where a single Al-layer is used as the back electrode layer, as above described, contact of the Al-layer with the substrate leads to the formation of alumina and to the possibility of poor ohmic contact. In order to prevent these, a double-layer structure is given to the back electrode layer and a photovoltaic device is manufactured in the following manner. The divided transparent electrode layers 2a, 2b, 2c... are arranged on the substrate 1 (FIG. 7), the semiconductive layer 3 and the Al-layer 4 are sequentially coated on the surface of the substrate including the transparent electrode layers 2a, 2b, 2c... respectively (FIG. 20), the divided semiconductive layers 3a, 3b, 3c . . . and the divided Al-layers 4a$_1$, 4b$_1$, 4c$_1$ . . . are formed for every photoelectric conversion element by irradiating laser beams (FIG. 21), a Ti-layer 4' is coated on the transparent electrode layer including the divided Al-layers 4a$_1$, 4b$_1$, 4c$_1$ . . . (FIG. 22), and then divided Ti-layers 4a$_2$, 4b$_2$, 4c$_2$ . . . are formed for every photoelectric conversion element by irradiating laser beams (FIG. 23). Thus, since the Al-layer is not brought into contact with the substrate, alumina is not formed.

Now, another method of removing the back electrode layer will be described. In this method, the laser beams are similar to those above described, i.e. the laser beams have an energy-distribution substantially uniform over the entire irradiation zone, and are irradiated from the substrate side onto the back electrode layer having a laminated structure in order to separate the back electrode layer.

In the process shown in FIG. 10, the back electrode layer 4 having one of the following three kinds of layer-structure is coated over the entire surface of the substrate 1 including the exposed portions of the divided amorphous semiconductive layers 3a, 3b, 3c. . . and the transparent electrode layers 2a, 2b 2c . . . .

(A) . . . A double-layer structure in which a Ti-layer (2,500 to 5,000 Å) is laminated on an Al-Ti alloy layer (B) . . . A double-layer structure in which a Ti-layer (2,500 to 5,000 Å) is laminated on an Al-layer (1,500 to 4,000 Å)

(C) . . . A four-layer structure in which a Ti-layer (1,000 to 2,000 Å), an Al-layer (1,000 to 2,000 Å), and a Ti-layer (1,000 to 2,000 Å) are laminated on an Al-layer (1,000 to 2,000 Å) in this order.

Incidentally the above described structure (A) is a double layer electrode structure obtained by adding, for example, an Al-Ti alloy layer in order to increase the melting point; (B) and (C) show examples of the electrode layer in which the layer thickness of each metallic layer is optimized so that the maximum temperature of the electrode layer may be lowered.

And, the technique, in which the described laser beams are irradiated from the substrate side on the back electrode laser, is detailed in U.S. Pat. No. 4,650,524 issued to the same assignee as the present invention.

In the final process shown in FIG. 19, the laser beams having an energy -distribution substantially uniform over the entire irradiation zone are irradiated from the side of the substrate 1 in the same manner as in the dividing process of the amorphous semiconductive layer 3 shown in the FIG. 9. Then, parts of the back electrode layer 4 are removed together with underlying parts of the amorphous semiconductive layers 3a, 3b, 3c . . . to form the divided back electrode layers 4a, 4b, 4c . . .

In this case, when the laser beams are irradiated from the substrate side, hydrogen and other gases included in the semiconductive layer are generated and a part of the back electrode layer is removed together with a part of the amorphous semiconductive layer by the action of a spouting force of hydrogen and said other gases and thermal stress during to a temperature-gradient.

As a result, the photoelectric conversion elements 5a, 5b, 5c . . . formed of the divided transparent electrode layers 2a, 2b, 2c . . . , the divided amorphous semiconductive layers 3a, 3b, 3c . . . and the divided back electrode layers 4a, 4b, 4c . . . laminated in this order are connected in series on the substrate 1.

Figure 24:
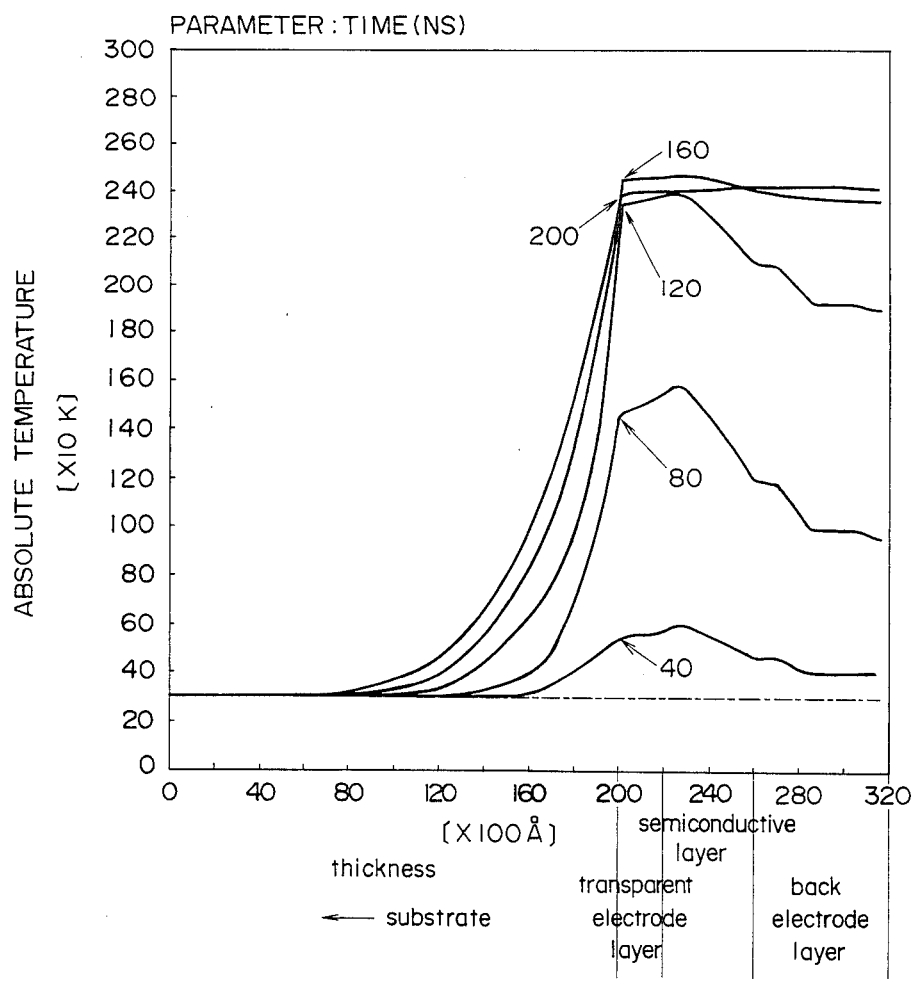
FIGS. 24 and 25 are temperature-change diagrams obtained when laser beams having an energy-distribution shown in FIG. 1 are irradiated from the substrate side on two kinds of back electrode layer having different multi-layer structures.
Figure 25:
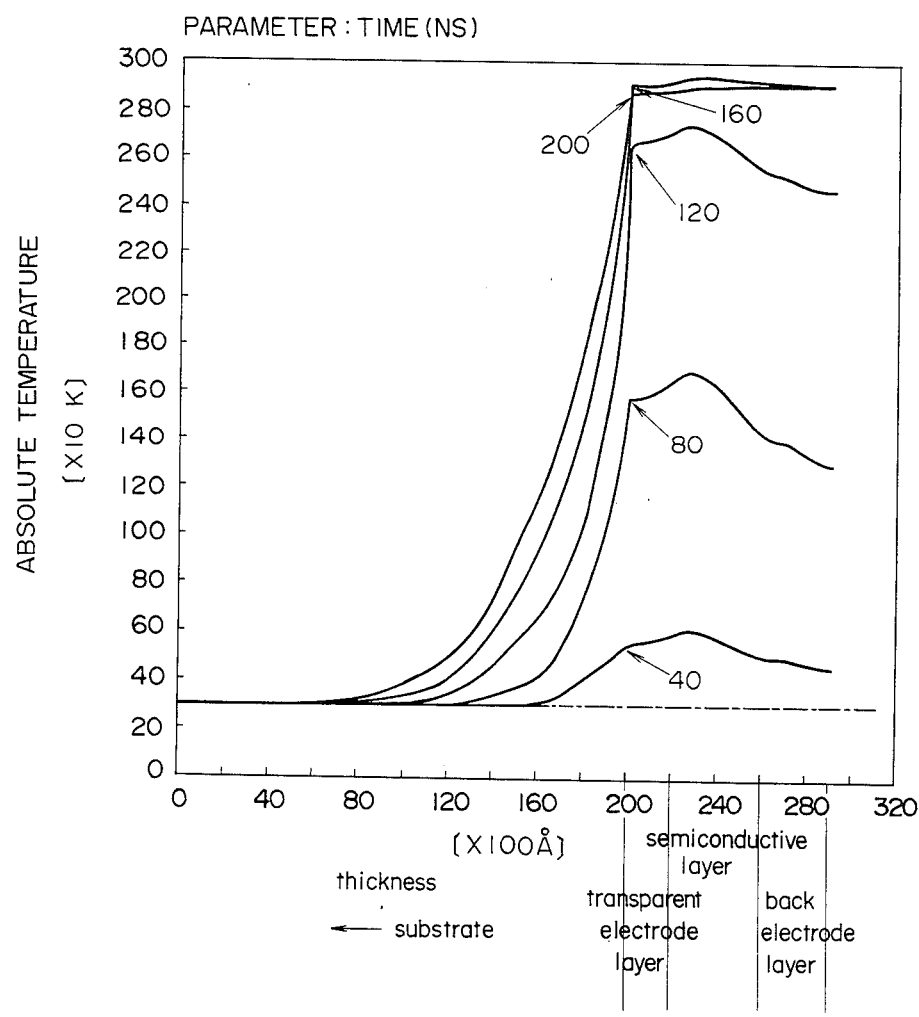

Next, the relation between the layer thickness of each metallic layer comprising the back electrode layer and the maximum temperature thereof will be described. For example, FIGS. 24, 25 show the changes in temperature-distribution in the direction of layer thickness from the surface of the substrate 1 with the central portion of the irradiation surface as the starting point with the lapse of time in the case where laser beams having a circular irradiation zone and an energy-distribution substantially uniform over the entire irradiation zone, shown in FIG. 12, are irradiated from the side of the substrate 1. FIG. 24 shows the case where the back electrod3e layer has the above described structure (C) and FIG. 25 shows the case where the back electrode layer has a double-layer structure (D) in which a Ti-layer (of about 2,000 Å thick) is laminated on an Al-layer (of about 1,000 Å thick). If the optimum layer-thicknesses of the Al-layer and the Ti-layer are not taken into consideration, the maximum temperature of the back electrode layer is 2,900K, as shown in FIG. 25, while it is only 2,400K when the back electrode layer having the above described structure (C) is used (FIG. 24).

Also, if a back electrode layer having the above described structure (B) is used, the maximum temperature can be made almost same as that in the case of the structure (C).

In the event that the back electrode layer having the above described structure (D) is used, the back electrode layer is heated to sufficiently high temperatures to completely fuse a part thereof, thereby generating droplets. In contrast, when the above described structures (B), (C) are used, the back electrode layer is not heated to high temperatures, so that the back electrode layer is removed without fusing until it is heated to the melting point. Accordingly, droplets are not generated. In addition, if the back electrode layer is removed without fusing, the edge of the removed portion is sharpened, thereby preventing the remaining back electrode layer from being formed. In short, it is necessary for the prevention of the generation of the droplets and the formation of the remaining back electrode layer only to set the thickness of each layer to an optimum value.

Next, the effects of the back electrode layer having the above described structure (A), i.e., a back electrode layer including an alloy layer, are described. The melting point of pure Al is about 930K while that of, for example, an Al-10 wt. % Ti-alloy is about 1,590K. In short, the addition of a small amount of Ti leads to a rise of only the melting point of the back electrode layer without harm to the properties necessary for the back electrode layer. As a result, fusion of the back electrode layer can be prevented without using the above described structure (B) or (C).

In addition, there is the possibility that a part of the back electrode layer is heated to high temperatures when irradiated by the laser beam, thereby considerably reducing the strength of the back electrode layer. And, in order to give a shear-machinable sharp edge to the removed portion and prevent the formation of residual back electrode layer, it is indispensable to keep a suitable strength of the back electrode layer when the laser beams are irradiated on it. The thickness of the back electrode layer is set so as to meet such a requirement.

The above described composite metallic, thin layer structures (A), (B), (C) are selected so as to give the back electrode layer the most suitable property for the removal of the back electrode layer by laser beam irradiating. The structure (C) is more suitable than the structure (B) as far as the properties of the composite material, but has a disadvantage in that its manufacturing process is complicated because of its four-layer structure. Thus, the structure was simplified in spite of the resultant slight inferiority in property to obtain the structure (B). It goes without saying that in the event that these layer-structures are used, use of optimum laser power is required and if that requirement is disregarded, the objects of the present invention cannot be achieved.

In addition, since the back electrode layer is removed by irradiating laser beams having a substantially uniform energy-distribution thereon, a low resistance layer is formed on the circumference of the removed portion of the amorphous semiconductive layer only to an insignificant extent.

Thus, the back electrode layers $4a$, $4b$, $4c$..., which have been divided in the final process shown in FIG. 19, are physically as well as electrically separated and the adjacent photoelectric conversion elements $5a$, $5b$, $5c$... can be precisely connected in series.

Primarily, the layer structures (A), (B), (C) have been described in the present preferred embodiments, but similar effects can be obtained if the melting point of the back electrode layer material is increased by adding V, Cr and the like in place of Ti in the structure (A), if Ag is used in place of Al (e.g. a TCO-layer 200–1,000 Å thick, an Ag-layer of 2,000–5,000 Å thick and a Ti-layer 2,000–5,000 Å thick) and Cr and/or Ni are (is) used in place of Ti in the structures (B) and (C), and in the event that TCO-layers such as an ITO-layer and a SnO$_2$-layer are placed between the amorphous semiconductive layer and the first metallic layer in the structures (A), (B), (C).

Figure 26:
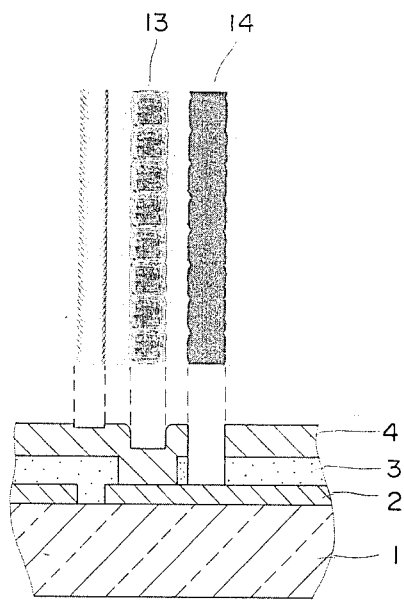
FIG. 26 is a photograph and a schematic sectional view showing a series connection portion of a photovoltaic device produced according to a method of the present invention.

FIG. 26 is a photograph and schematic sectional view showing a series connection portion of an apparatus according to the present invention in which a separating line 14 is clearly present on an edge thereof. In addition, in FIG. 26 a removing line 13 of the amorphous semiconductive layer and the separating line 14 of the back electrode layer are formed of continuous regular squares because the iris has a regular square shape.

Figure 27:
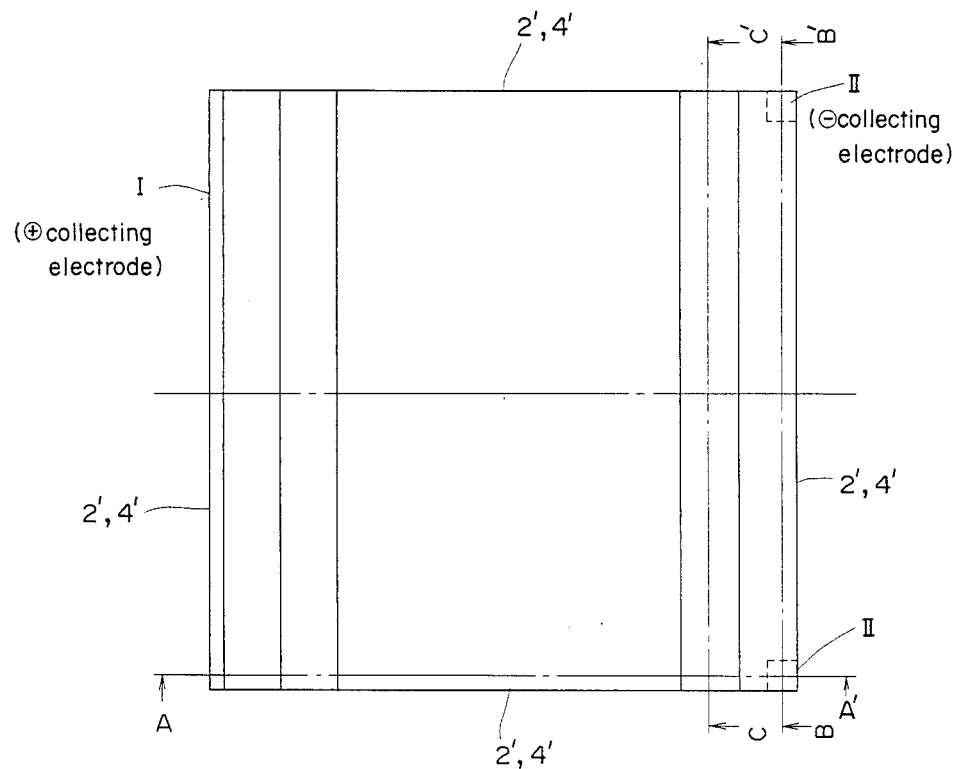
FIG. 27 is a schematic top view showing a photovoltaic device manufactured according to a method of the present invention.
Figure 28:
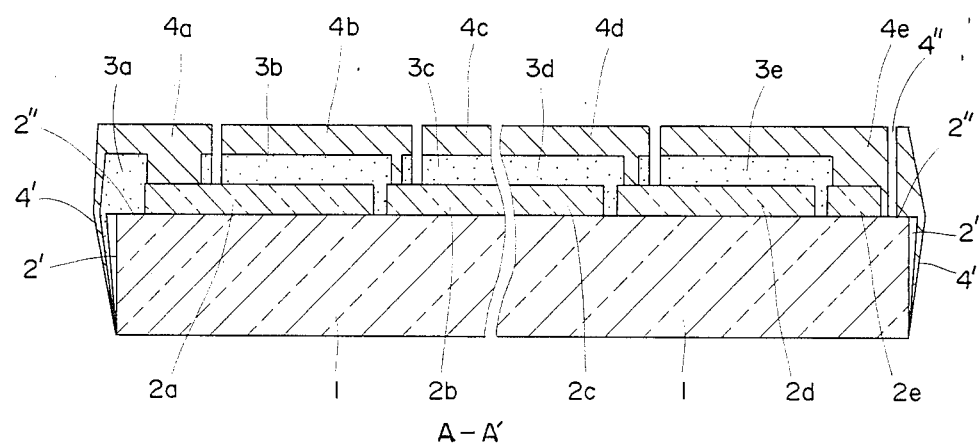
FIG. 28 is a schematic sectional view of FIG. 27 taken along the series-connecting direction thereof (line A—A')

Although the photoelectric conversion elements can be connected in series by the above described method, the transparent electrode layer and the back electrode layer frequently reach to the side surface of the substrate in the process of coating the transparent electrode layer shown in FIG. 6 as well as in the process of coating the back electrode layer shown in FIG. 10 ($2'$, $4'$ in FIGS. 27 to 30). In this case, even though the upper surface of the substrate is subjected to the process of dividing the transparent electrode layer shown in FIG. 7 and the process of dividing the back electrode layer shown in FIGS. 11, 19 the adjacent spaces, $2a$ to $2e$ and $4a$ to $4e$ in FIG. 28 are short-circuited through $2'$ and $4'$ on the side surface of the substrate, whereby effective electric isolation cannot be achieved.

Accordingly, in the process of dividing the transparent electrode layer, the edge portion of the upper surface of the substrate is subjected to the irradiation of laser beams on at least two sides thereof (three sides in this embodiment) to remove the transparent electrode layer in a width of 10 to 200 μm, shown as $2'$ in FIGS. 28 to 30, and in the process of dividing the back electrode layer, the back electrode within the removed portion of the transparent electrode layer is subjected to the irradiation of laser beams to remove the back electrode layer at the end thereof, shown as $4'$ in FIGS. 28 to 30. Thus, incomplete division of the transparent electrode layer and the back electrode layer at the side edges of the substrate can be completely prevented and the yield of the products can be remarkably increased. Besides, in this case, since the effective electricity-generating zone lost by the removal of the transparent electrode layer is small in area, the reduction of the electricity-generating capacity is not insubstantial.

In additional, + and − electrodes for outputting the electrical power are required for the photovoltaic device. According to the present invention, the + and − electrodes can be formed, as shown in FIG. 27 by I and II, by dividing a part of the surface of the substrate using laser beams in the processes of dividing the transparent electrode layer and the back electrode layer without adding any new process.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within the metes and bounds of the claims, or equivalence of such metes and bounds thereof are therefore intended to be embraced by the claims.

What is claimed is:

1. A method of manufacturing a photovoltaic device, in which a plurality of photoelectric conversion elements each comprising a first electrode layer, a semiconductive layer, and a second electrode layer are laminatedly arranged on an insulative surface of a substrate and said photoelectric conversion elements are electrically connected in series with each other, comprising the steps of:
   dividedly arranging the first electrode layer on the surface of the substrate,
   coating the semiconductive layer on the surface of the substrate including the upper surface of the first electrode layer,
   dividing the semiconductive layer element by irradiating energy-beams having an energy-distribution which is substantially uniform over the entire irradiated zone of the semiconductive layer,
   coating the second electrode layer on the semiconductive layer, and
   dividing the second electrode layer in order to define each element.

2. A method of manufacturing a photovoltaic device as set forth in claim 1, in which said step of dividedly arranging the first electrode layer comprises coating the first electrode layer on the surface of the substrate and then dividing the first electrode layer by irradiating energy-beams on the first electrode layer.

3. A method of manufacturing a photovoltaic device as set forth in claim 1, in which said step of dividedly arranging the first electrode layer comprises coating the first electrode layer on the surface of the substrate and then etching the first electrode layer with a photo resist as a mask.

4. A method of manufacturing a photovoltaic device as set forth in claim 1, in which said first electrode layer comprises a substantially transparent electrode layer.

5. A method of manufacturing a photovoltaic device as set forth in claim 1, in which said second electrode layer comprises a substantially transparent electrode layer.

6. A method of manufacturing a photovoltaic device as set forth in claim 1, in which said semiconductive layer comprises an amorphous silicon layer of 3,000 to 7,000 Å thickness and a surface of said semiconductive layer is heated to a temperature of at least 1,200K by irradiating energy-beams thereon.

7. A method of manufacturing a photovoltaic device, in which a plurality of photoelectric conversion elements each comprising a first electrode layer, a semiconductive layer, and a second electrode layer are laminately arranged on an insulative surface of a substrate and said photoelectric conversion elements are electrically connected in series with each other, comprising the steps of:

dividedly arranging the first electrode layer on the surface of the substrate, coating the semiconductive layer on the surface of the substrate including the upper surface of the first electrode layer, dividing the semiconductive layer, coating the second electrode layer on the semiconductive layer, and dividing the second electrode layer in order to define each element, by irradiating energy-beams having an energy-distribution which is substantially uniform over the entire irradiated zone of the second electrode layer.

8. A method of manufacturing a photovoltaic device as set forth in claim 7, in which said step of dividedly arranging the first electrode layer comprises coating the first electrode layer on the surface of the substrate and then dividing the first electrode layer by irradiating energy-beams on the first electrode layer.

9. A method of manufacturing a photovoltaic device as set forth in claim 7, in which said step of dividedly arranging the first electrode layer comprises coating the first electrode layer on the surface of the substrate and then etching the first electrode layer with a photo-resist as a mask.

10. A method of manufacturing a photovoltaic device as set forth in claim 7, in which said first electrode layer comprises a substantially transparent electrode layer.

11. A method of manufacturing a photovoltaic device as set forth in claim 7, in which said second electrode layer comprises a substantially transparent electrode layer.

12. A method of manufacturing a photovoltaic device as set forth in claim 7, in which said second electrode layer includes at least an Al layer of at least 2,000 Å thickness and a surface of said Al layer is heated to temperatures of at least 1,000 K by irradiating energy-beams thereon.

13. A method of manufacturing a photovoltaic device as set forth in claim 7, in which during said step of dividing the second electrode layer underlying portions of the semiconductive layer are removed at the same time.

14. A method of manufacturing a photovoltaic device, in which a plurality of photoelectric conversion elements each comprising a first electrode layer, a semiconductive layer, and a second electrode layer are laminately arranged on an insulative surface of a substrate and said photoelectric conversion elements are electrically connected in series with each other, comprising the steps of:

dividedly arranging the first electrode layer on the surface of the substrate, coating the semiconductive layer on the surface of the substrate including the upper surface of the first electrode layer, dividing the semiconductive layer, coating the second electrode layer on the semiconductive layer, dividing the second electrode layer in order to define each element, characterized in that energy-beams having an energy-distribution which is substantially uniform over the entire irradiated zone are used for the step of dividing the semiconductive layer and the step of dividing the second electrode layer and these steps are carried out in the order recited.

15. A method of manufacturing a photovoltaic device as set forth in claim 14, in which said step of dividedly arranging the first electrode layer comprises coating the first electrode layer on the surface of the substrate and then dividing the first electrode layer by irradiating energy-beams on the first electrode layer.

16. A method of manufacturing a photovoltaic device as set forth in claim 14, in which said step of dividedly arranging the first electrode layer comprises coating the first electrode layer on the surface of the substrate and then etching the first electrode layer with a photo-resist as a mask.

17. A method of manufacturing a photovoltaic device as set forth in claim 14, in which said first electrode layer comprises a substantially transparent electrode layer.

18. A method of manufacturing a photovoltaic device as set forth in claim 14, in which said second electrode layer comprises a substantially transparent electrode layer.

19. A method of manufacturing a photovoltaic device as set forth in claim 14, in which said semiconductive layer comprises an amorphous silicon layer of 3,000 to 7,000 Å thickness and a surface of said semiconductive layer is heated to a temperature of at least 1,200K by irradiating energy-beams thereon.

20. A method of manufacturing a photovoltaic device as set forth in claim 14, in which said second electrode layer includes at least an Al layer of at least 2,000 Å thickness and a surface of said Al layer is heated to temperatures of at least 1,000K by irradiating energy-beams thereon.

21. A method of manufacturing a photovoltaic device as set forth in claim 14, in which during said step of dividing the second electrode layer underlying portions of the semiconductive layer are removed at the same time.

22. A method of manufacturing a photovoltaic device, in which a plurality of photoelectric conversion elements each comprising a first electrode layer, a semiconductive layer, and a second electrode layer are laminately arranged on an insulative surface of an energy-permeable substrate and said photoelectric conversion elements are electrically connected in series with each other, comprising the steps of:

dividedly arranging the first electrode layer on the surface of the substrate, coating the semiconductive layer on the surface of the substrate including the upper surface of the first electrode layer, dividing the semiconductive layer, coating the second electrode layer on the semiconductive layer, dividing the second electrode layer in order to define each element, characterized in that energy-beams having an energy-distribution which is substantially uniform over the entire irradiated zone are used for the steps of dividing the semiconductive layer and the second electrode layer and the step of dividing the second electrode layer comprises irradiating said beams thereon from the side of the energy-permeable substrate, these steps being carried out in the order recited.

23. A method of manufacturing a photovoltaic device as set forth in claim 22, in which said step of dividedly arranging the first electrode layer comprises coating the first electrode layer on the surface of the substrate and then dividing the first electrode layer by irradiating energy-beams thereon.

24. A method of manufacturing a photovoltaic device as set forth in claim 22, in which said step of dividedly arranging the first electrode layer comprises coating the first electrode layer on the surface of the substrate and then etching the first electrode layer with a photo-resist as a mask.

25. A method of manufacturing a photovoltaic device as set forth in claim 22, in which said first electrode layer comprises a substantially transparent electrode layer.

26. A method of manufacturing a photovoltaic device as set forth in claim 22, in which said second electrode layer comprises a substantially transparent electrode layer.

27. A method of manufacturing a photovoltaic device as set forth in claim 22, in which said second electrode layer has a multi-layer structure.

28. A method of manufacturing a photovoltaic device as set forth in claim 27, in which each layer constituting said multi-layer structure is formed of a material selected from the group consisting of Al, Ag, Cr, Ni, Ti, $SnO_2$, and ITO.

29. A method of manufacturing a photovoltaic device as set forth in claim 27, in which an alloy layer is included in said multi-layer structure.

30. A method of manufacturing a photovoltaic device as set forth in claim 29, in which said alloy layer is formed of Al or Ag containing additive metals chosen from Ti, V, and Cr.

31. A method of manufacturing a photovoltaic device as set forth in claim 27, in which said multi-layer structure is a double-layer structure consisting of an Al-layer 1,500 to 4,000 Å thick and a Ti-layer 2,500 to 5,000 Å thick.

32. A method of manufacturing a photovoltaic device as set forth in claim 27, in which said multi-layer structure is a four-layer structure consisting of an Al-layer 1,000 to 2,000 Å thick, a Ti-layer 1,000 to 2,000 Å thick, an Al-layer 1,000 to 2,000 Å thick and a Ti-layer 1,000 to 2,000 Å thick.

33. A method of manufacturing a photovoltaic device as set forth in claim 27, in which said multi-layer structure is a three-layer structure consisting of a TCO-layer 200 to 1,000 Å thick, an Ag-layer 2,000 to 5,000 Å thick and a Ti-layer 2,000 to 5,000 Å thick.

34. A method of manufacturing a photovoltaic device, in which a plurality of photoelectric conversion elements each comprising a first electrode layer, a semiconductive layer, a second electrode layer, and a third electrode layer are laminatedly arranged on an insulative surface of a substrate and said first electrode layer of one of said elements is electrically connected with said third electrode layer of an adjacent of said elements, whereby said photoelectric conversion elements are electrically connected in series with each other, comprising the steps of:

dividedly arranging the first electrode layer on the surface of the substrate, coating the semiconductive layer on the surface of the substrate including the upper surface of the first electrode layer, coating the second electrode layer on the semiconductive layer, dividing the semiconductive layer and the second electrode layer, coating the third electrode layer on the second electrode layer, and dividing the third electrode layer in order to define each element, characterized in that the semiconductive layer and the second electrode layer are divided by irradiating energy-beams having an energy-distribution which is substantially uniform over the entire irradiated zone of the second electrode layer.

35. A method of manufacturing a photovoltaic device as set forth in claim 34, in which said second electrode layer is an Al mono-layer or a double-layer structure consisting of a TCO-layer and a metal layer and said third electrode layer is a layer including at least Al or Ti.

36. A method of manufacturing a photovoltaic device, in which a plurality of photoelectric conversion elements each comprising a first electrode layer, a semiconductive layer, a second electrode layer, and a third electrode layer are laminatedly arranged on an insulative surface of a substrate and said first electrode layer of one of said elements is electrically connected with said third electrode layer of an adjacent of said elements, whereby said photoelectric conversion elements are electrically connected in series with each other, comprising the steps of:

dividedly arranging the first electrode layer on the surface of the substrate, coating the semiconductive layer on the surface of the substrate including the upper surface of the first electrode layer, coating the second electrode layer on the semiconductive layer, dividing the semiconductive layer and the second electrode layer, coating the third electrode layer on the second electrode layer, and dividing the third electrode layer in order to define each element, characterized in that the third electrode layer is divided by irradiating energy-beams having an energy-distribution which is substantially uniform over the entire irradiated zone of the third electrode layer.

37. A method of manufacturing a photovoltaic device as set forth in claim 36, in which said second electrode layer is an Al mono-layer or a double-layer structure consisting of a TCO-layer and metal layer and said third electrode layer is a layer including at least Al or Ti.

38. A method of manufacturing a photovoltaic device, in which a plurality of photoelectric conversion elements each comprising a first electrode layer, a semiconductive layer, a second electrode layer, and a third electrode layer are laminatedly arranged on an insulative surface of a substrate and said first electrode layer of one of said elements is electrically connected with said third electrode layer of an adjacent one of said elements, whereby said photoelectric conversion elements are electrically connected in series with each other, comprising the steps of:

dividedly arranging the first electrode layer on the surface of the substrate, coating the semiconductive layer on the surface of the surface of the substrate including the upper surface of the first electrode layer, coating the second electrode layer on the semiconductive layer, dividing the semiconductive layer and the second electrode layer, coating the third electrode layer on the second electrode layer, and dividing the third electrode layer in order to define each element, characterized in that energy-beams having an energy-distribution which is substantially uniform over the entire irradiated zone are used for the steps of dividing the semiconductive layer and the second electrode layer by irradiating said beams on the second electrode layer, and for the step of dividing the third electrode layer by irradiating said beams on the third electrode layer, and the steps are carried out in the order recited.

39. A method of manufacturing a photovoltaic device as set forth in claim 38, in which said second electrode layer is an Al mono-layer or a double-layer structure consisting of a TCO-layer and a metal layer and said third electrode layer is a layer including at least Al or Ti.

40. A method of manufacturing a photovoltaic device, in which a plurality of photoelectric conversion elements each comprising a first electrode layer, a semiconductive layer, and a second electrode layer are laminatedly arranged on an insulative surface of a substrate and said photoelectric conversion elements are electrically connected in series with each other, comprising the steps of:

dividedly arranging the first electrode layer on the surface of the substrate, coating the semiconductive layer on the surface of the substrate including the upper surface of the first electrode layer, dividing the semiconductor layer, coating the second electrode layer on the semiconductive layer, dividing the second electrode layer in order to define each element, and removing a preselected width of the first electrode layer on an end portion in the series connecting direction of photoelectric conversion elements on the substrate, characterized by the step of dividing the semiconductive layer comprising irradiating with energy-beams having an energy-distribution which is substantially uniform over the entire irradiated zone of the semiconductive layer, and the step of dividing the second electrode layer comprises irradiating the energy-beams on the second electrode layer coated on the substrate within the zone where portions of the first electrode layer were removed in the division thereof.

41. A method of manufacturing a photovoltaic device as set forth in claim 40, in which said preselected width is 10 to 200 $\mu$m.

42. A method of manufacturing a photovoltaic device, in which a plurality of photoelectric conversion elements each comprising a first electrode layer, a semiconductive layer, and a second electrode layer are laminatedly arranged on an insulative surface of a substrate and said photoelectric conversion elements are electrically connected in series with each other, comprising the steps of:

dividedly arranging the first electrode layer on the surface of the substrate, coating the semiconductive layer on the surface of the substrate including the upper surface of the first electrode layer, dividing the semiconductive layer, coating the second electrode layer on the semiconductive layer, and dividing the second electrode layer in order to define each element, characterized in that energy-beams having an energy-distribution which is substantially uniform over the entire irradiated zone are irradiated on a portion of the substrate to remove a portion or all of the layers coated on said portion of the substrate, thereby forming a current collecting electrode for outputting electrical power of the photovoltaic device.

* * * * *